United States Patent
Van der Velden

(10) Patent No.: US 10,891,788 B2
(45) Date of Patent: Jan. 12, 2021

(54) SYSTEMS AND METHODS FOR FINITE ELEMENT MESH REPAIR

(71) Applicant: Dassault Systemes Simulia Corp., Johnston, RI (US)

(72) Inventor: Alexander Jacobus Maria Van der Velden, Atlanta, GA (US)

(73) Assignee: DASSAULT SYSTEMES SIMULIA CORP., Johnston, RI (US)

( * ) Notice: Subject to any disclaimer, the term of this patent is extended or adjusted under 35 U.S.C. 154(b) by 457 days.

(21) Appl. No.: 15/840,808

(22) Filed: Dec. 13, 2017

(65) Prior Publication Data

US 2019/0179984 A1    Jun. 13, 2019

(51) Int. Cl.
*G06T 17/20* (2006.01)
*G06F 30/23* (2020.01)

(52) U.S. Cl.
CPC .......... *G06T 17/205* (2013.01); *G06F 30/23* (2020.01); *G06T 17/20* (2013.01)

(58) Field of Classification Search
CPC ... G06T 17/20; G06T 17/205; G06F 17/5018; G06F 30/23
See application file for complete search history.

(56) References Cited

U.S. PATENT DOCUMENTS

| | | | | |
|---|---|---|---|---|
| 7,274,364 B2 * | 9/2007 | Sederberg | ............... | G06T 17/20 345/420 |
| 8,405,659 B2 * | 3/2013 | Lakshmanan | ............ | G06T 17/20 703/2 |
| 8,531,456 B2 * | 9/2013 | Fischer | ................... | G06T 17/20 345/419 |
| 8,558,833 B1 * | 10/2013 | Moreton | ................. | G06T 17/20 345/423 |
| 8,749,551 B2 * | 6/2014 | Chang | ..................... | G06T 17/20 345/423 |
| 9,135,750 B2 * | 9/2015 | Schmidt | .................. | G06T 17/20 |
| 10,769,850 B1 * | 9/2020 | DeSimone | ............ | G06T 17/205 |

OTHER PUBLICATIONS

Attene, M., et al. "Polygon Mesh Repairing: An Application Perspective" ACM Computing Surveys, vol. 45, No. 2, article 15 (2013) (Year: 2013).*

(Continued)

*Primary Examiner* — Jay Hann
(74) *Attorney, Agent, or Firm* — Hamilton, Brook, Smith & Reynolds, P.C.

(57) ABSTRACT

Unlike existing methods that rely on manual procedures for repairing finite element meshes in computer-based simulations, embodiments automatically repair finite element meshes for use in simulations of real-world objects. One such embodiment begins by identifying a non-compliant mesh element in a finite element mesh and extracting a mesh patch from the finite element mesh that includes the identified non-compliant mesh element. To continue, an invariant patch description for the extracted mesh patch is generated and a repair solution corresponding to the generated invariant patch description is obtained from a database storing pre-determined repair solutions. In turn, the mesh patch in the finite element mesh is repaired using the obtained repair solution.

18 Claims, 8 Drawing Sheets

(56) References Cited

OTHER PUBLICATIONS

Attene, M & Falcidieno, B. "ReMESH: An Interactive Environment to Edit and Repair Triangle Meshes" Proceedings of IEEE Int'l Conf. on Shape Modeling & Applications (2006) (Year: 2006).*

Ruiz-Gironés, E., et al. "High-order Mesh Curving by Distortion Minimization with Boundary Nodes Free to Slide on a 3D CAD Representation" Computer-Aided Design, vol. 72, pp. 52-64 (2016) (Year: 2016).*

Campen, et al., "A Practical Guide to Polygon Mesh Repairing," *Eurographics*, 2012.

Knupp, P. M., "Algebraic mesh quality metrics for unstructured initial meshes," *Finite Elements in Analysis and Design, Elsevier Science B.V.*, vol. 39, Issue 3, pp. 217-241 (2003).

Lowe, "Object Recognition from Local Scale-Invariant Features," *Proc. of the Int'l Conf on Computer Vision*, University of British Columbia ICCV, 1999.

McCulloch, et al., "A logical calculus of the ideas immanent in nervous activity," *Bulletin of Mathematical Biophysics*, vol. 5, pp. 115-133, 1943.

European Search Report, EP18212148.3, entitled,"Systems and Methods for Finite Element Mesh Repair," dated Apr. 23, 2019.

Attene, et al., "Polygon Mesh Repairing: An Application Perspective," ACM Computing Surveys, ACM, New York, NY, 45(2):1-33, (Feb. 2013).

Cowan et al., "Rotationally invariant distortion resistant finite-elements," ScienceDirect, 275:189-203, (2014).

Kraevoy, et al., "Template-Based Mesh Completion", Proc. 3rd Eurographics Symp. on Geometry Proc., Jul. 4, 2005, (10 pages).

Wang, et al., "Computational biomechanical modelling of the lumbar spine using marching-cubes surface smoothened finite element voxel meshing," Computer Methods & Programs in Biomedicine, 80:25-35 (2005).

* cited by examiner

SYSTEMS AND METHODS FOR FINITE ELEMENT MESH REPAIR

BACKGROUND

A number of existing product and simulation systems are offered on the market for the design and simulation of parts or assemblies of parts. Such systems typically employ computer aided design (CAD) and/or computer aided engineering (CAE) programs. These systems allow a user to construct, manipulate, and simulate complex three-dimensional models of objects or assemblies of objects. These CAD and CAE systems, thus, provide a representation of modeled objects using edges or lines, in certain cases with faces. Lines, edges, faces, or polygons may be represented in various manners, e.g. non-uniform rational basis-splines (NURBS).

CAD systems manage parts or assemblies of parts of modeled objects, which are mainly specifications of geometry. In particular, CAD files contain specifications, from which geometry is generated. From geometry, a representation is generated. Specifications, geometries, and representations may be stored in a single CAD file or multiple CAD files. CAD systems include graphic tools for representing the modeled objects to designers; these tools are dedicated to the display of complex objects. For example, an assembly may contain thousands of parts. A CAD system can be used to manage models of objects, which are stored in electronic files.

The advent of CAD and CAE systems allows for a wide range of representation possibilities for objects. One such representation is a finite element analysis (FEA) model. The terms FEA model, finite element model (FEM), finite element mesh, and mesh are used interchangeably herein. A FEM typically represents a CAD model, and thus, may represent one or more parts or an entire assembly. A FEM is a system of points called nodes which are interconnected to make a grid, referred to as a mesh. The FEM may be programmed in such a way that the FEM has the properties of the underlying object or objects that it represents. When a FEM or other such object representation as is known in the art is programmed in such a way, it may be used to perform simulations of the object that it represents. For example, a FEM may be used to represent the interior cavity of a vehicle, the acoustic fluid surrounding a structure, and any number of real-world objects and physical systems. Moreover, CAD and CAE systems along with FEMs can be utilized to simulate engineering systems. For example, CAE systems can be employed to simulate noise and vibration of vehicles.

SUMMARY

Embodiments of the invention generally relate to the field of computer programs and systems and specifically to the field of product design and simulation. Embodiments of the invention may be employed in video games, engineering system design and fabrication, collaborative decision making, and entertainment, e.g., movies.

More specifically, embodiments provide improved methods and systems for simulating real-world physical objects. As described hereinabove, simulations are performed using finite element meshes which represent the object being simulated. Modern meshes are complicated and thus, meshes are typically automatically generated based on a CAD model, i.e., solid model. These generated meshes typically include errors, e.g., mesh elements that do not adhere to specific quality metrics. For instance, automatically created (raw) meshes often use heuristic rules to create the mesh topology in combination with mesh node location (x,y,z) optimization to meet specific application requirements. These heuristic based end-user rules sometimes conflict and an automated mesh suitable to the application is not always generated.

While methods exist for correcting these errors, such as those described in Campen et al., "A Practical Guide to Polygon Mesh Repairing," *Eurographics*, 2012, the contents of which are incorporated herein by reference, these existing methods require manual intervention by expert users. This manual intervention is complicated and greatly increases the time it takes to perform a simulation. Embodiments of the present invention overcome these problems and provide methods and systems that automatically repair a finite element mesh in a simulation of a real-world physical object represented by the finite element mesh. Embodiments employ previously non-existent rules to automatically repair finite element meshes that existing methods could only repair through manual/user action.

One such example embodiment is a computer-implemented simulation method that repairs a finite element mesh in a simulation of a real-world physical object represented by the finite element mesh. Such an embodiment begins by identifying a non-compliant mesh element in a finite element mesh representing a real-world physical object and extracting a mesh patch from the finite element mesh that includes the identified non-compliant mesh element. To continue, an invariant patch description for the extracted mesh patch is generated and a repair solution corresponding to the generated invariant patch description is obtained from a database. In turn, the mesh patch in the finite element mesh is repaired using the obtained repair solution from the database which results in a repaired finite element mesh.

In an embodiment, the non-compliant mesh element is identified by a finite element simulation preprocessor based on specific rules with respect to its allowed geometry, e.g., aspect ratio, skew, angles, corner angles, etc. According to another embodiment, the non-compliant mesh element is identified based on an angle of the non-compliant mesh element. In yet another embodiment, the extracted mesh patch includes the non-compliant mesh element and each mesh element in the finite element mesh adjacent to the non-compliant mesh element. Other finite element simulation preprocessors and/or solvers are suitable.

According to an embodiment, the invariant patch description is based on edge type of edges along a perimeter of the extracted mesh patch. In another embodiment, repairing the mesh not only uses the obtained repair solution in the database but, also includes optimizing the location of nodes in the mesh patch being repaired. An alternative embodiment of the method further includes functionality for repairing the mesh even when a pre-determined repair solution corresponding to the generated invariant patch description is unavailable. In such an embodiment, to repair the mesh, (1) a representation of, or indication of, the extracted mesh patch is provided to a user, (2) a repair solution for the extracted mesh patch is received from the user, and (3) the received repair solution is stored along with the generated invariant patch description in the database. The obtained and stored repair solution is, in turn, used to repair the mesh patch. Moreover, the stored repair solution may be employed in future implementations to repair similar defects.

Further still, embodiments provide functionality for optimizing and simulating the real-world object that the finite element mesh represents. In one such embodiment, the repaired finite element mesh is provided to a finite element simulation solver and the finite element simulation solver uses the repaired finite element mesh in a finite element simulation of the real-world object. Such a simulation may include optimizing the design of the real-world object that the finite element model represents. Even further still, an embodiment may control a manufacturing device to create the underlying real-world object based upon results of the simulation performed using the repaired finite element mesh. In such an embodiment, the simulation may identify design changes and after these changes are identified, a manufacturing device may be controlled so as to create the real-world object itself reflecting these design changes.

Another embodiment of the present invention is directed to a system for repairing a finite element mesh in a simulation of a real-world physical object represented by the finite element mesh. The system comprises a processor and a memory with computer code instructions stored thereon that cause the system to repair the finite element model according to any embodiment described herein. In an embodiment of the system, the processor and the memory, with the computer code instructions, cause the system to identify a non-compliant mesh element in a finite element mesh and extract a mesh patch from the finite element mesh that includes the identified non-compliant mesh element. In turn, the system generates an invariant patch description for the extracted mesh patch. The system is configured to communicate with a database that stores pre-determined repair solutions to obtain a repair solution that corresponds to the generated invariant patch description. The repair solution obtained from the database is then used by the system to repair the finite element mesh.

In an example embodiment of the system, the non-compliant mesh element is identified by a finite element simulation preprocessor. According to yet another embodiment of the system, in identifying the non-compliant mesh element, the processor and the memory, with the computer code instructions, are further configured to cause the system to identify the non-compliant mesh element based on an angle of the non-compliant mesh element. In yet another embodiment, the extracted mesh patch includes the non-complain mesh element and each mesh element in the finite element mesh adjacent to said non-compliant mesh element.

Another embodiment of the system is configured to generate the invariant description based on edge type of edges along a perimeter of the extracted mesh patch. According to another embodiment, in repairing the finite element mesh, the processor and the memory, with the computer code instructions, are further configured to cause the system to optimize node locations in the mesh patch. Embodiments of the system are also configured to repair the finite element mesh when a repair solution does not exist. In one such embodiment, the system (i) provides a representation of, or indication of, the extracted mesh patch to a user for correction, (ii) receives a repair solution for the extracted mesh patch from the user, (iii) stores the received repair solution along with the generated invariant patch description in the database, and (iv) repairs the mesh using the stored repair solution. Yet another embodiment of the system is configured to implement a simulation using the repaired finite element mesh. In such an embodiment, the system is configured to provide the repaired finite element mesh to a finite element simulation solver where the finite element simulation solver, responsively, uses the repaired finite element mesh in a finite element simulation of the real-world object.

Another embodiment of the present invention is directed to a cloud computing implementation that automatically repairs a finite element mesh. Such an embodiment is directed to a computer program product executed by a server in communication across a network with one or more clients, where the computer program product comprises a computer readable medium. In such an embodiment, the computer readable medium comprises program instructions which, when executed by a processor, causes the processor to identify a non-compliant mesh element in a finite element mesh and extract a mesh patch from the finite element mesh that includes the identified non-compliant mesh element. Further, the executed program instructions cause the cause the processor to (i) generate an invariant patch description for the extracted mesh patch, (ii) communicate with a database to obtain a repair solution corresponding to the generated invariant patch description, and (iii) repair the mesh patch in the finite element mesh using the obtained repair solution.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

Figure 1:
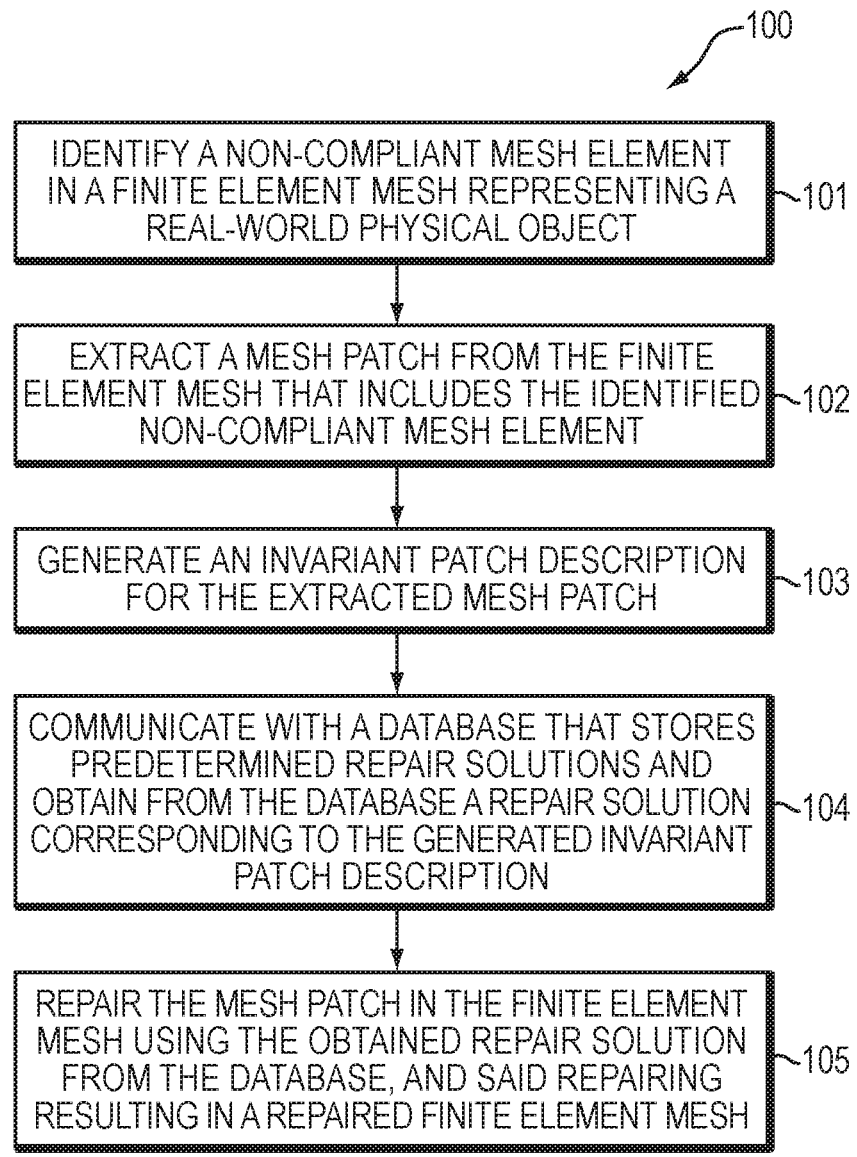
FIG. 1 is a flowchart of a method for repairing a finite element mesh according to an embodiment.

A description of example embodiments follows.

The teachings of all patents, published applications, and references cited herein are incorporated by reference in their entirety.

Digital three-dimensional (3D) models, e.g., finite element models and meshes, are key components in many industrial and scientific sectors. In numerous domains, polygon meshes have become a de facto standard for model representation and thus, representation of real-world physical objects. In practice, meshes often have a number of defects and flaws that make the meshes incompatible with the requirements of specific applications. Hence, repairing such defects in order to achieve compatibility is an important task in both academic and industrial applications that rely on finite element meshes.

However, the mesh repair problem is ill-posed, i.e., there is no unique solution and the solution can change dramatically with small changes to the object being meshed. The mesh repair problem has inherent topological and geometrical ambiguities, requires domain knowledge, heuristics, and interactive user input. Furthermore, the aforementioned problems are all application specific. Thus, repairing meshes utilizing existing methods, such as those described in Campen et al., "A Practical Guide to Polygon Mesh Repairing," which adapts raw mesh models created by automatic processes to specific application requirements, requires an intimate knowledge of both mesh repair and each particular application and industry. The mesh repair problem is also difficult because repairing the mesh can introduce other errors. Therefore, repair solutions need to consider application context to make appropriate trade-offs so as to provide a solution that meets application requirements and provides guarantees regarding the repaired mesh.

Further, while meshes often contain various defects, many applications, such as finite element simulation solvers, assume ideal meshes that are free from defects and flaws. However, typically, 1% of automatically generated mesh elements fail to adhere to application-specific requirements. This leaves users to rely on existing mesh repair processes that are highly labor intensive human-machine processes that may take up to a third of the overall simulation process time. The fact that this manual step is required for each design instance limits the study of automatically created simulation design geometry variants.

Embodiments of the present invention solve these problems and provide functionality to automatically repair finite element meshes. In one such embodiment individual mesh repair solutions for particular applications (e.g., automotive body-in-white) are transformed into invariant topology solutions that can be optimized for specific conditions through node location optimization to repair meshes that are topologically similar. Embodiments leverage a library of solutions to provide this functionality. For example, in a particular embodiment, an end-user can build a pool of invariant mesh repair solutions that can automatically be applied to future repairs. Thus, the number of manual repairs needed will go down over time as embodiments are utilized.

FIG. 1 is a flowchart of a method 100 for repairing a finite element mesh according to an embodiment. The method 100 may be computer implemented and performed via any combination of hardware and software as is known in the art. For example, the method 100 may be implemented via one or more processors with associated memory storing computer code instructions that cause the processor to implement the method 100.

The method 100 begins at step 101 by identifying a non-compliant mesh element in a finite element mesh representing a real-world physical object. In embodiments, the non-compliant mesh element is any component of a finite element mesh that does not conform with industry, application, or solver requirements, amongst others. For instance, the non-compliant mesh element may be a node, an edge, and any combination of nodes and edges. According to an embodiment, the non-compliant mesh element is non-compliant with regard to requirements of a finite element simulation solver in which the mesh is being used. For instance, a solver may have particular requirements, e.g., angles, positions, tri and quad face corner angles, aspect ratios, skews, sizes, topologies, and geometries, that meshes must conform with and when a given mesh element does not comply with said requirements, the mesh element may be considered non-compliant. In such an embodiment, the non-compliant mesh element can be automatically identified by the finite element simulation solver. In another example embodiment, the standard for compliance may be a product of user or application requirements. For instance, a particular application may require elements be at particular angles or skews and when given mesh elements are not within these boundaries they are considered non-compliant. Further, non-compliance may be determined as described in Knupp, "Algebraic mesh quality metrics for unstructured initial meshes," Finite Elements in Analysis and Design, Vol. 39, Issue 3, January 2003, the contents of which are herein incorporated by reference. In Knupp, explicit formulas for size, shape, skew, and combined mesh quality metrics are given for triangular, tetrahedral, quadrilateral, and hexahedral finite elements where the formulas are examples of abstractly defined metrics whose essential properties serve to guide the formulation of effective metrics.

To continue, at step 102, a mesh patch from the finite element mesh that includes the non-compliant mesh element identified at step 101 is extracted. According to an embodiment, the mesh patch is extracted so that the non-compliant mesh element can be corrected. In an embodiment, extracting the mesh patch includes removing the mesh patch from the finite element mesh. In another example embodiment, a copy of the circumference of the mesh patch's nodes is made and ultimately, the repair is made inside this circumference and the repaired extracted patch replaces the original patch or the original patch is modified to mirror the repaired patch. In an example embodiment, the extracted mesh patch includes the non-compliant mesh element and each mesh element in the finite element mesh that is adjacent, e.g., next to or touching, the non-compliant mesh element identified at step 101. Moreover, embodiments may identify the mesh patch to be extracted in any variety of ways. For instance, in one example embodiment, elements of the mesh with shared vertices from the defective mesh element comprise the mesh patch. In another embodiment, the mesh patch includes the elements that share nodes with the defective mesh element. In an alternative embodiment, "extracting" the mesh patch includes re-creating and storing the mesh patch so the repairs can be replicated on the mesh patch in the finite element mesh after the necessary changes are identified. In yet another embodiment, "extracting" the mesh patch at step 102 comprises simply identifying the mesh patch so that in step 103, as described herein below, an invariant description for the mesh patch can be generated.

Next, at step 103, an invariant patch description for the extracted mesh patch is generated. According to an embodiment, at step 103, the invariant description of the extracted mesh patch is generated based upon one or more rules that can be applied to other patches such that each unique patch has a corresponding unique description. However, according to an embodiment, the rules for generating invariant descriptions used at step 103 generate descriptions that are invariant to certain operations, such as size and rotation. Thus, if two mesh patches are identical but for their size, these mesh patches are not "unique" for purposes of generating an invariant description and thus, would each have the same invariant description.

In embodiments of the method 100, the invariant patch description may be generated using any methodology. For instance, in an embodiment, the invariant patch description generated at step 103 is based on edge type of edges along a perimeter of the extracted mesh patch. Further, in another embodiment, the invariant patch description is generated using the method 330 depicted in FIG. 3 and described herein below.

At step 104 the method 100 continues and the invariant patch description generated at step 103 is leveraged by communicating with a database storing pre-determined repair solutions to obtain a repair solution that corresponds to the generated invariant patch description. In such an embodiment, a body of repair solutions, i.e., changes to finite element mesh patches that repair the mesh patches, is stored on a database. These existing repair solutions can be previously identified solutions that are stored by users and service providers. According to an embodiment, each repair solution is stored in the database along with a corresponding invariant description, generated using the same methodology as in step 103. If a description is found in the database at step 104 the repair solution corresponding to the description found in the database can be used to repair the extracted mesh patch because the invariant descriptions searched in step 104 are generated using the same method used in step 103. Simply, in an embodiment, at step 104, the database is searched to identify an invariant description that matches, possibly exactly, the invariant description generated at step 103 and the repair solution that is stored along with the matching invariant description, is, in turn, obtained.

The method 100 may also include functionality for repairing the mesh when an invariant patch description corresponding to the invariant patch description generated at step 103 is not found at step 104, i.e., when the database has no repair solution corresponding to the generated invariant patch description. To provide such functionality, when no repair solution is found in the database a representation of, or indication of, the extracted mesh patch is provided to a user for correction. The user provides a solution for the extracted mesh patch which is obtained at a computing device implementing the method 100. This obtained solution is used in step 105 as described herein below to correct the finite element mesh. Moreover, the obtained solution can also be stored in the database with the invariant description generated at step 103. In this way, the body of solutions increases as the method is implemented and these generated solutions can be stored for future use to automatically repair finite element meshes that have non-compliant mesh elements with the same invariant description.

In an alternative embodiment, if no repair solution is found at step 104, the method returns to step 102 and extracts a different mesh patch that includes the non-compliant mesh element. In such an embodiment, if, for example, the mesh patch initially included mesh elements with vertices adjacent to the defective mesh element, in this new attempt, the mesh patch may be expanded to include all mesh elements that share nodes with the defective mesh element. To continue, a new invariant patch description is generated at step 103 for this new mesh patch and the database is searched again at step 104 to determine if a repair solution exists for the new mesh patch. By changing the mesh patch, the invariant description changes, and thus, the search is changed at step 104 in an attempt to again find a repair solution for the mesh element.

The method 100 continues at step 105 where the mesh patch in the finite element mesh is repaired using the repair solution obtained at step 104. Repairing the mesh at step 105 results in a repaired finite element mesh. Repairing the mesh patch at step 105 may include modifying elements, e.g., edges and nodes, of the mesh based on the repair solution obtained at step 101. Such operations may include changing the number of nodes and angles, locations, and geometrical location of elements in the mesh. Further, repairing the mesh at step 105 may also include optimizing node locations in the mesh patch. The node optimization may maintain the topology (network of nodes) but, change the (x,y,z) location of the individual nodes. In an embodiment, the node optimization may be carried out using a non-linear optimization method.

As described hereinabove, repairing the mesh, such as at step 105, may introduce new errors. Thus, in an embodiment, the method 100 may be repeated until there are no more errors. In another embodiment, rules relating to mesh compliance, e.g., rules that indicate when a mesh element is non-compliant, may be relaxed by allowing bigger aspect ratios, skew angles, etc., if for example, a mesh free from errors cannot be obtained.

The method 100 may also include performing a finite element simulation of the real-world physical object using the repaired mesh resulting from step 105. In one such example embodiment, the method 100 continues by providing the repaired finite element mesh to a finite element simulation solver and the finite element simulation solver responsively, uses the repaired finite element mesh in a finite element simulation of the real-world object. In an alternative embodiment, the method 100 is implemented by a finite element simulation solver as part of executing a simulation, and thus, upon completing the repair, the solver proceeds and the simulation is performed.

Figure 2:
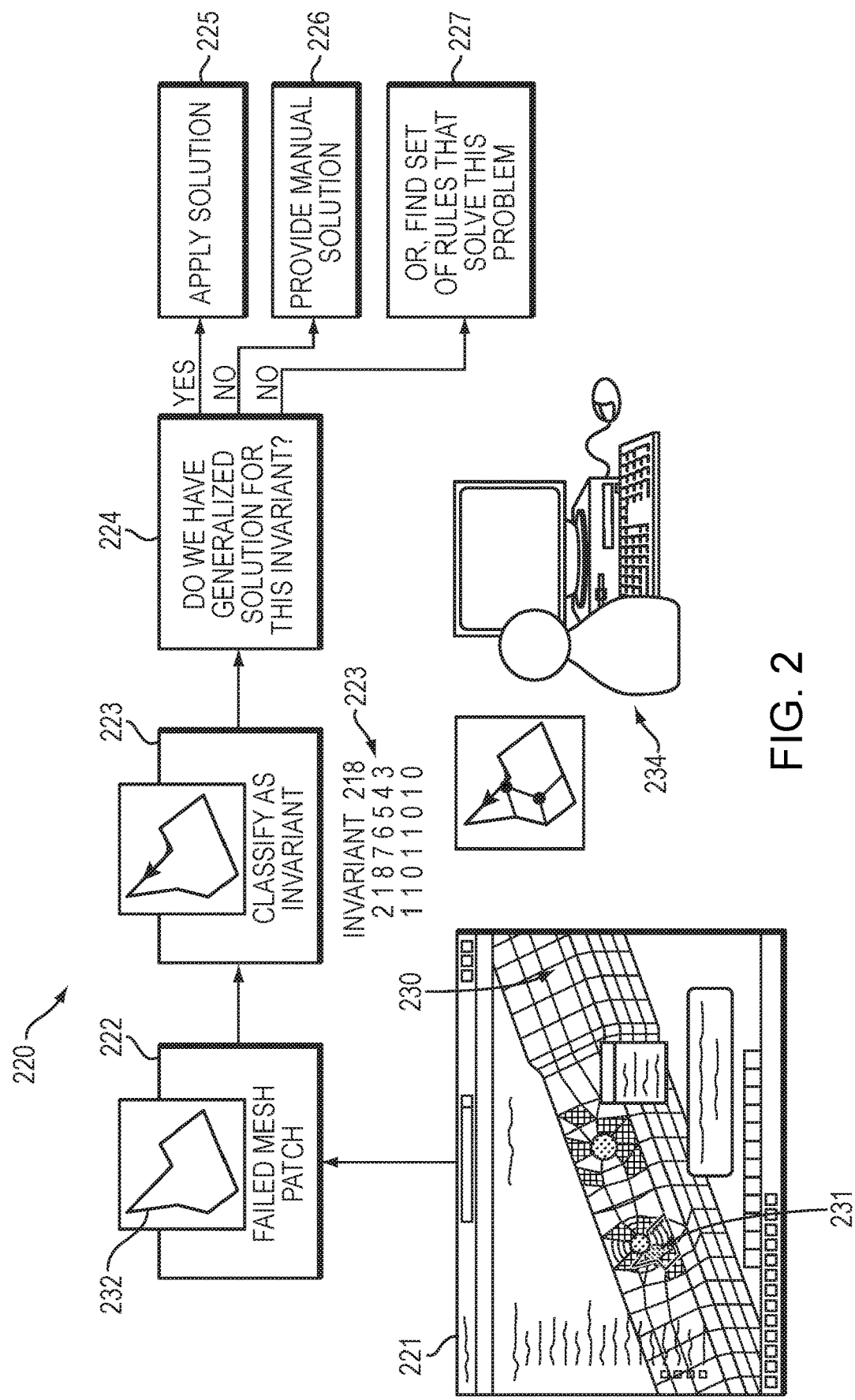
FIG. 2 is a schematic diagram illustrating a workflow to repair a finite element mesh in an embodiment.

FIG. 2 is a diagram depicting a workflow 220 for repairing a finite element mesh. At step 221 mesh elements on a raw mesh that do not adhere to application requirements, such as angles, skew, etc., are identified. Step 221 may also include displaying the mesh 230 and the non-compliant mesh element 231. The displayed mesh 230 and mesh element 231 may be colored or highlighted in the display. The workflow 220 continues and at step 222 where a mesh patch 232 is extracted from the finite element mesh 230 that includes the failed mesh element 231 and elements adjacent to the failed mesh element 231. In an embodiment, all other elements of the finite element mesh 230 remain unchanged during the extraction process 222 and repair process 220. Next, at step 223, an invariant mesh patch description 233 is created. In an example embodiment, the invariant description created at step 223 is generated based on edge type of the edges around the perimeter of the extracted mesh patch 232. In such an embodiment, edge types may include: shared with another element, edge is part of a hole, edge is at the part edge, edge is joined with another part, etc.

To continue, at step 224, a check is made to determine if there is a pre-existing solution with the same invariant mesh patch topological description. This check may include scanning any number of memory storage devices, e.g., databases, that are communicatively coupled to a computing device implementing the workflow 220. If a solution exists, the workflow continues to step 225 and applies the preexisting solution to repair the finite element mesh 230. At step 225, a node optimization may also be performed that includes determining whether it is possible to optimize the node locations while still adhering to the specific application requirements. Further, if multiple solutions are identified at step 224, these multiple solutions are applied sequentially at step 225 to repair the finite element mesh.

If however, no solution is identified at step 224, the workflow 220 continues to either step 226 or step 227 to repair the finite element mesh. At step 226 a user 234 creates a solution manually by either adding or subtracting nodes and/or edges to the mesh patch 232. The user 234 may also optimize the node locations. At step 227, the user 234 creates a set of local modifications to the mesh rules to cure the non-compliant mesh element. In such an embodiment, at step 227, the user 234 starts with one or more existing rule and modifies this rule to correct the non-compliant mesh element. In such an embodiment, the original mesh rule that was used may be maintained in its original form and the modified rule may be stored as a new rule along with the invariant description created at step 223 for future use.

Figure 3:
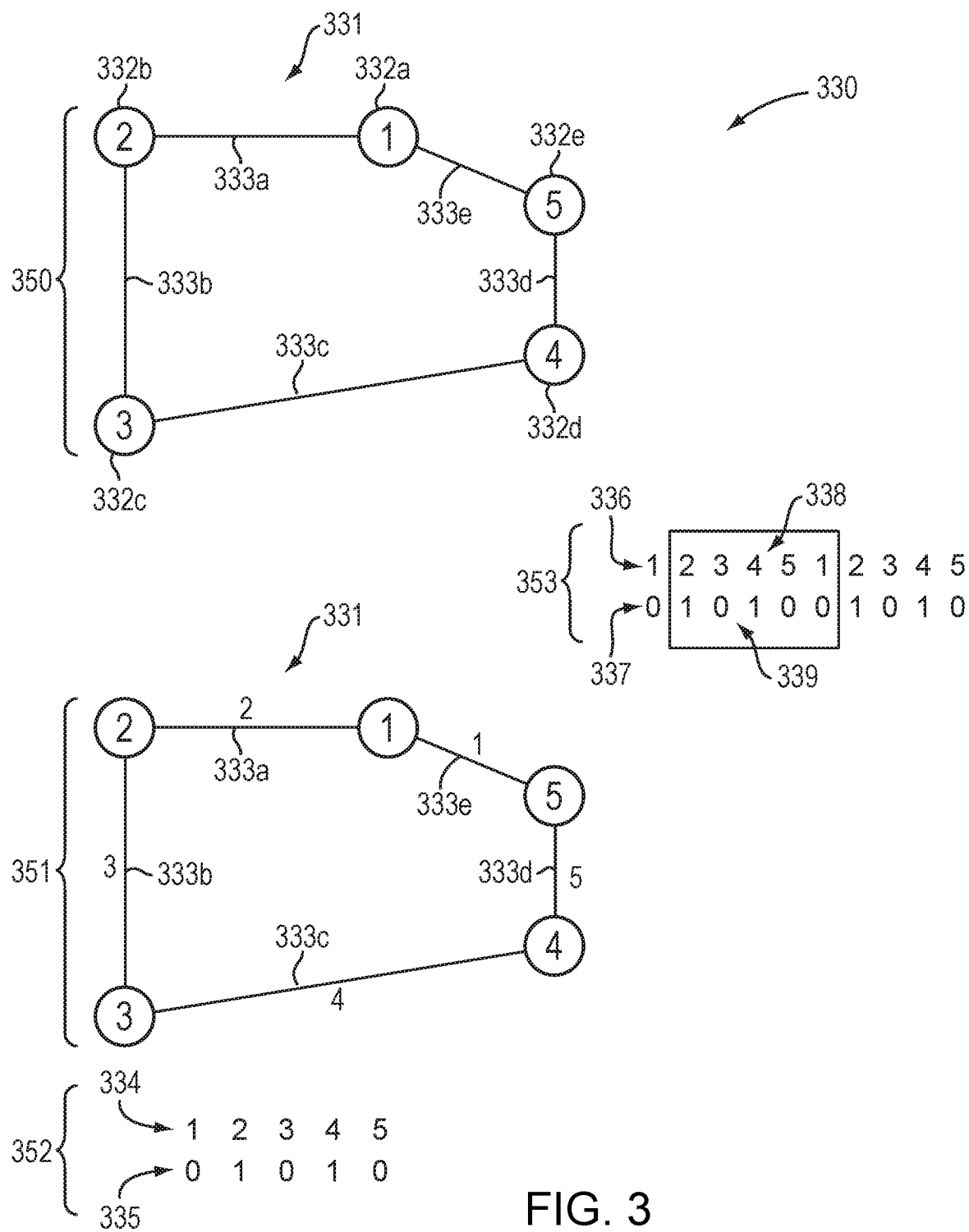
FIG. 3 is a diagram illustrating steps of a method to determine an invariant description for a patch of a finite element mesh.

FIG. 3 illustrates a process 330 for generating invariant mesh patch descriptions that may be employed in embodiments of the present invention, such as the method 100 and workflow 220. The process 330 creates a mesh description that is a number, e.g., a binary sequence, that is invariant to changes such as rotation, size, and mirror/flip of the mesh patch. In mathematics, an invariant is a property held by a class of objects which remains unchanged when transformations of a certain type are applied to the objects. The particular class of objects and type of transformations are typically indicated by the context in which the object is used. For the process 330, the mesh patch description is invariant to changes including rotation, re-sizing, mirroring, and flipping. Thus, any number of mesh patches that are different because of rotation, size, mirroring, and flipping will still have the same patch description.

The process 330 begins at step 350 with a non-compliant mesh patch, i.e., non-compliant quad or tri element, 331 that includes the nodes 332a-e and edges 333a-e. Next, at step 351, the edges 333a-e are numbered (1-5) starting at any edge in a given direction, e.g., counter clockwise. As depicted in FIG. 3, the edges 333a-e are number 2, 3, 4, 5, and 1, respectively. To continue, at step 352, a given binary value is assigned for each edge type. In the method 330, edges that form part of a hole are assigned 1 and edges that are shared with another mesh element are assigned 0. At step 352, this yields the edge numbers 334 and the corresponding binary values 335. Finally, at step 353, the invariant description is identified by repeating the edge numbers 334 and corresponding binary values 335 to create the number sequences 336 and 337. Then, the sequence 337 is examined to identify the highest binary number 339 that can be created that includes all of the corresponding edges 338 of the mesh patch 331. According to an embodiment, the binary number 10100 or the corresponding decimal value, 20, of the binary sequence 339 is used as the invariant description (classification number) for the mesh patch 331 and the invariant description 339 is stored with a repair solution for repairing the mesh patch 331.

A large majority of bad, i.e., non-compliant, mesh element patches comprise 10 or less edge curves. Thus, using the process 330, 2^10 (≈1000) invariant solutions define the entire solution space. Assuming there are repair solutions for each invariant description, this enables the automatic repair of 10,000 elements in less than a minute. Further, in an embodiment, this can be sped up by further refining the invariant solution, at the cost of needing more manual repair solutions. In an example embodiment, refining the invariant solution includes using shared nodes to define the adjacent elements in the patch. This results in mesh patches having more nodes but, requires more repair solutions to be stored because there are "classes." In another example, the solutions are refined by ordering the solutions according to geometric proportions such as aspect ratio. This method breaks up the solution space into more classes. Moreover, because mesh repair is an ill posed problem and hence, there is no unique solution, any number of refinements can be done at the cost of actually filing the classes with repair solutions. While the method 330 depicts a particular process of generating an invariant description, embodiments of the present invention art not so limited and may use any variety of invariant description generating methodologies. For instance, in an example embodiment, the circumference of the patch is described as a set of vectors of a given length that are connected by angles and this circumference is scaled into a unit square.

Figure 4:
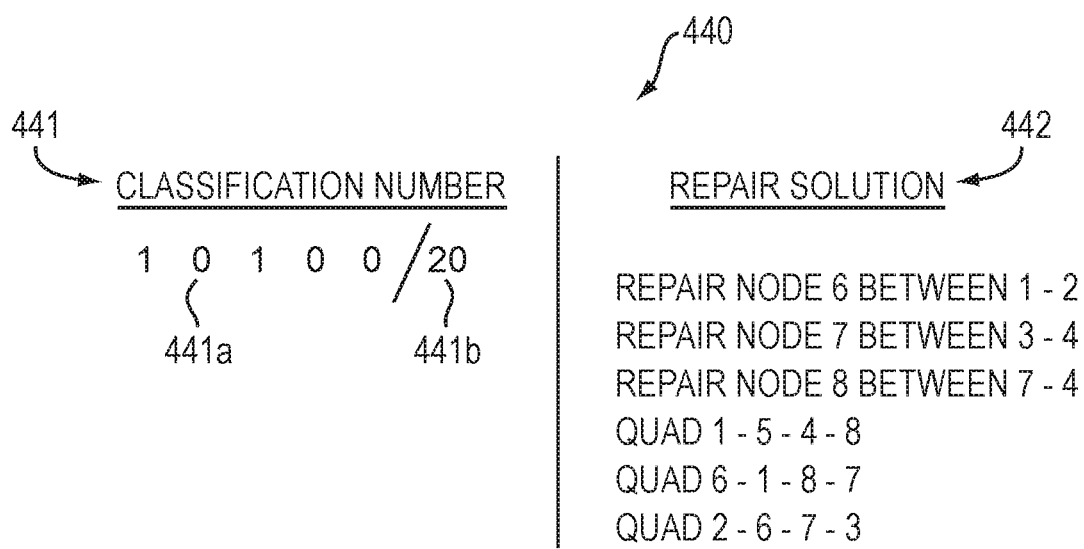
FIG. 4 depicts an example data structure having an entry in a storage device that includes an invariant description and corresponding (associated) solution as may be used in embodiments.

FIG. 4 illustrates an entry 440 in a storage device (data structure therein) that includes an invariant description 441 and repair solution 442 that may be used to correct a mesh patch corresponding to the invariant description 441. The entry 440 stores the classification number 441 determined in the method 330 depicted in FIG. 3 and the repair solution 442 for the mesh patch 331 illustrated in FIG. 3. As discussed hereinabove, the classification number may be stored as the binary sequence 441a or decimal value 441b and, embodiments, may likewise store both values 441a and 441b. Moreover, the entry 441 stores the repair solution 442 that corresponds to the classification number 441. The repair solution 442 is a description of the repairs needed to correct the mesh patch that corresponds to the classification number 441. The repair solution indicates that the repair node 6 is added between the nodes 1 and 2, the repair node 7 is added between the nodes 3 and 4 and the repair node 8 is added between the nodes 7 and 4. Moreover, the repair solution 442 indicates that the quads 1-5-4-8, 6-1-8-7, and 2-6-7-3 are formed. The indication of forming the quads serves to indicate the edge connections to make and additional edges to add. The repair solution 442 may alternatively indicate the edge connections themselves that are a part of the solution rather than indicating the edge connection via the quad indications. In addition, the repair solution may also indicate the node positions be optimized within the topology defined by the solution, i.e., the node locations between other nodes and the quadrants formed. It is noted that while FIG. 4 illustrates a single repair solution, embodiments can leverage any number of storage devices storing any number of repair solutions.

Figure 5:
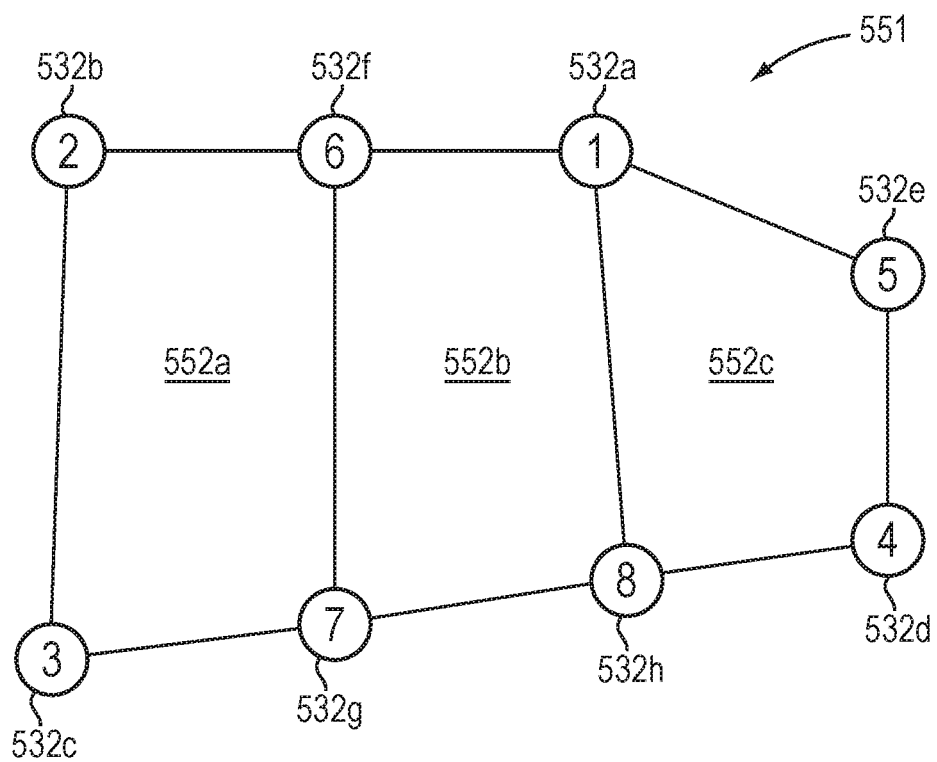
FIG. 5 is a diagram illustrating a finite element patch repaired according to an embodiment.

FIG. 5 illustrates the mesh patch 551 after the repair solution 442 has been carried out on the mesh patch 331. In the repaired mesh 551 depicted in FIG. 5, the node 532f is added between the nodes 532a and 532b, the node 532g is added between the nodes 532c and 532d, and the node 532h is added between the nodes 532g and 532d. Furthermore, edges are added to form the quads 552a-c. In an embodiment, the repairs are carried out in order by using a sequential set of repairs that make up the repair solution.

Figure 6:
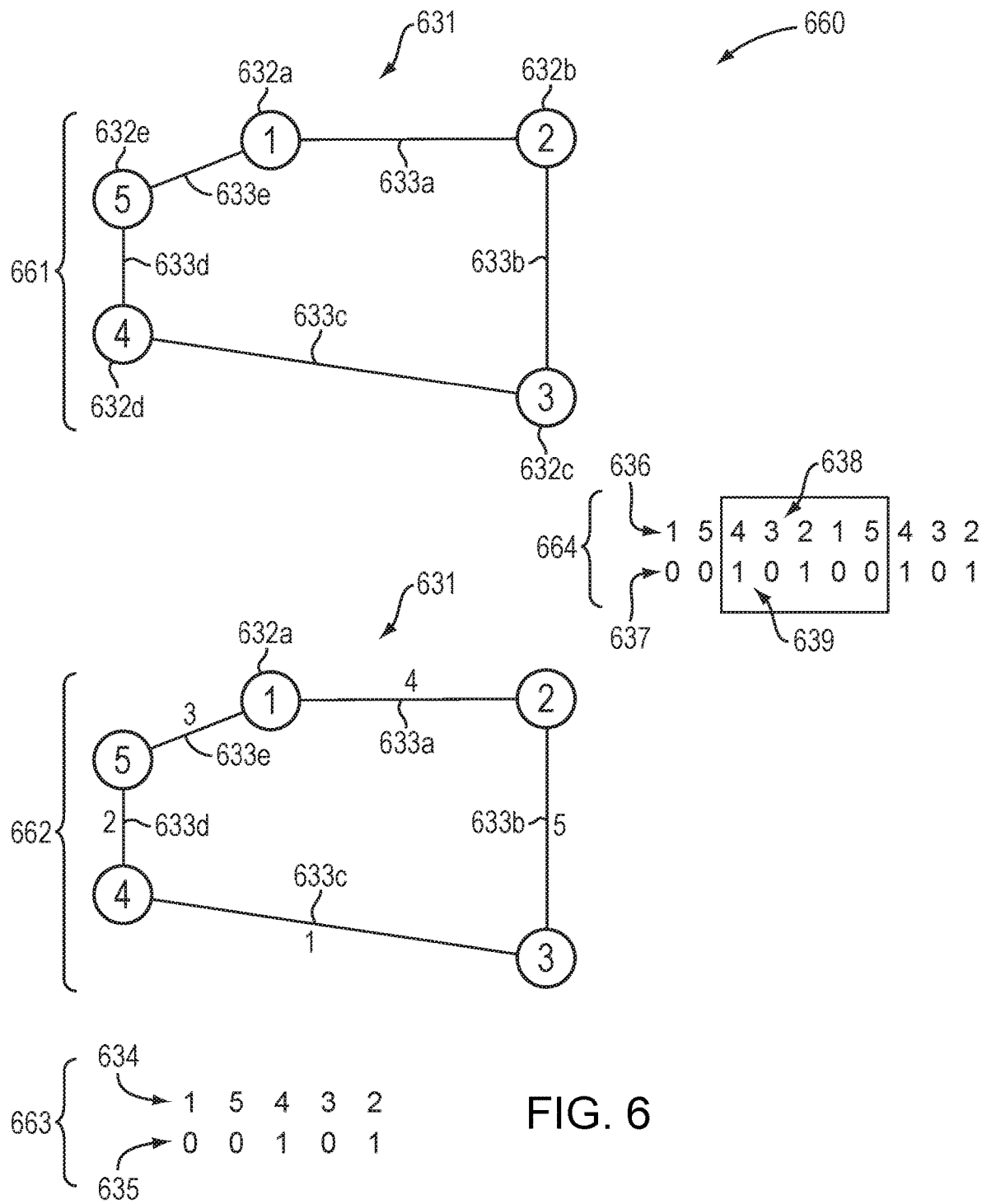
FIG. 6 illustrates a method of generating an invariant description verifying the method depicted in FIG. 3.

FIG. 6 depicts a process 660 that verifies the process 330 for generating invariant descriptions. As described hereinabove, the process 330 creates an invariant description that is invariant to changes such as rotation, size, mirror, and flip of the mesh patch. In FIG. 6, the mesh patch 331 has been flipped such that node locations in the horizontal x have been changed to negative x to create the mesh patch 631. In turn, the process 660 is carried out similarly to the process 330.

The process 660 begins at step 661 with a the non-compliant mesh patch 631 that includes the nodes 632a-e and the edges 633a-e. Next, at step 662, the edges 633a-e are numbered (1-5) starting at any edge in a given direction, e.g., clockwise. As depicted in FIG. 6, the edges 633a-e are numbered 4, 5, 1, 2, and 3, respectively. To continue, at step 663, a given binary value is assigned for each edge type. In the method 660, edges that form part of a hole are assigned 1 and edges that are shared with another mesh element are assigned 0. At step 663, this yields the edge numbers 634 and the corresponding binary values 635. Finally, at step 664, the invariant description is identified by repeating the edge numbers 634 and corresponding binary values 635 to create the sequences 636 and 637. Then, the sequence 637 is examined to identify the highest binary number 639 that can be created that includes all of the corresponding edges 638 of the mesh patch 631. Like the process depicted in FIG. 3, the maximum binary number 639 is 10100. Thus, even though the mesh 631 is a flipped version of the mesh 331, the process 660 for generating the invariant description yields the same invariant classification number 639.

Figure 7:
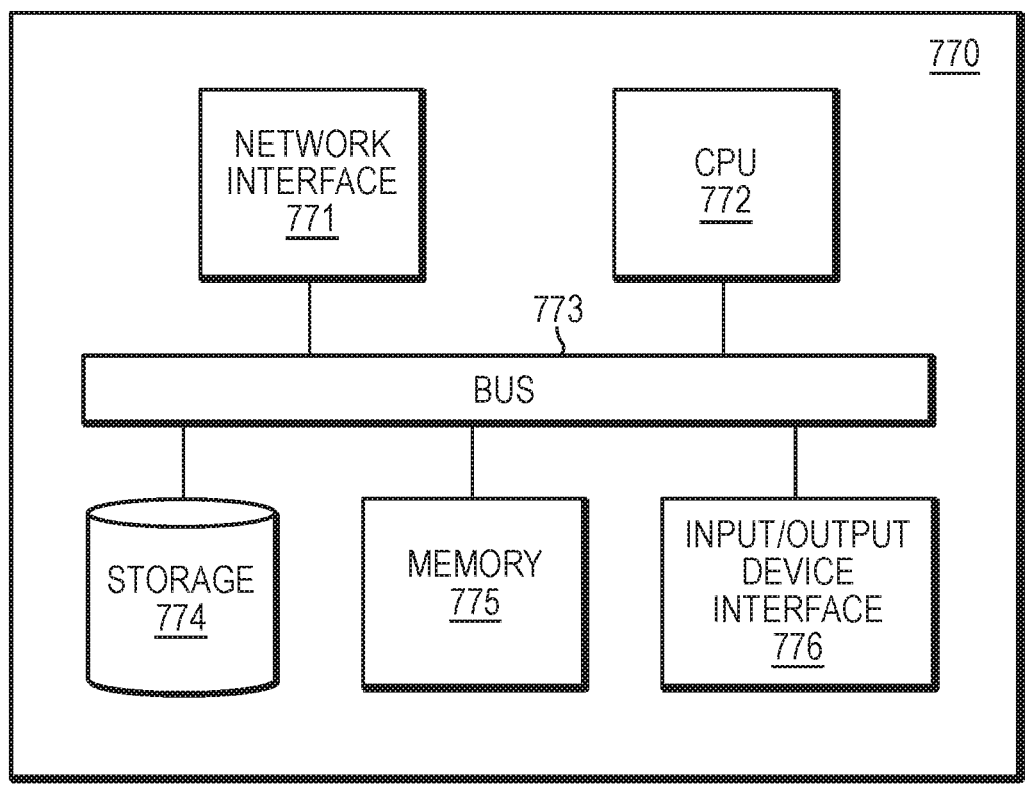
FIG. 7 is a simplified block diagram of a computer system for repairing a finite element mesh according to an embodiment.

FIG. 7 is a simplified block diagram of a computer-based system 770 that may be used to generate and optimize a real-world object according to any variety of the embodiments of the present invention described herein. The system 770 comprises a bus 773. The bus 773 serves as an interconnect between the various components of the system 770. Connected to the bus 773 is an input/output device interface 776 for connecting various input and output devices such as a keyboard, mouse, display, speakers, etc. to the system 770. A central processing unit (CPU) 772 is connected to the bus 773 and provides for the execution of computer instructions implementing embodiments. Memory 775 provides volatile storage for data used for carrying out computer instructions implementing embodiments such as previously described in FIGS. 1-6. Storage 774 provides non-volatile storage for software instructions, such as an operating system (not shown) and embodiment configurations, etc. The system 770 also comprises a network interface 771 for connecting to any variety of networks known in the art, including wide area networks (WANs) and local area networks (LANs).

It should be understood that the example embodiments described herein may be implemented in many different ways. In some instances, the various methods and machines described herein may each be implemented by a physical, virtual, or hybrid general purpose computer, such as the computer system 770, or a computer network environment such as the computer environment 880, described herein below in relation to FIG. 8. The computer system 770 may be transformed into the machines that execute the methods described herein, for example, by loading software instructions into either memory 775 or non-volatile storage 774 for execution by the CPU 772. One of ordinary skill in the art should further understand that the system 770 and its various components may be configured to carry out any embodiments or combination of embodiments of the present invention described herein. Further, the system 770 may implement the various embodiments described herein utilizing any combination of hardware, software, and firmware modules operatively coupled, internally, or externally, to the system 770. Further, the system 770 may be communicatively coupled to or be embedded within a manufacturing device so as to control the device to create a physical object as described herein.

Figure 8:
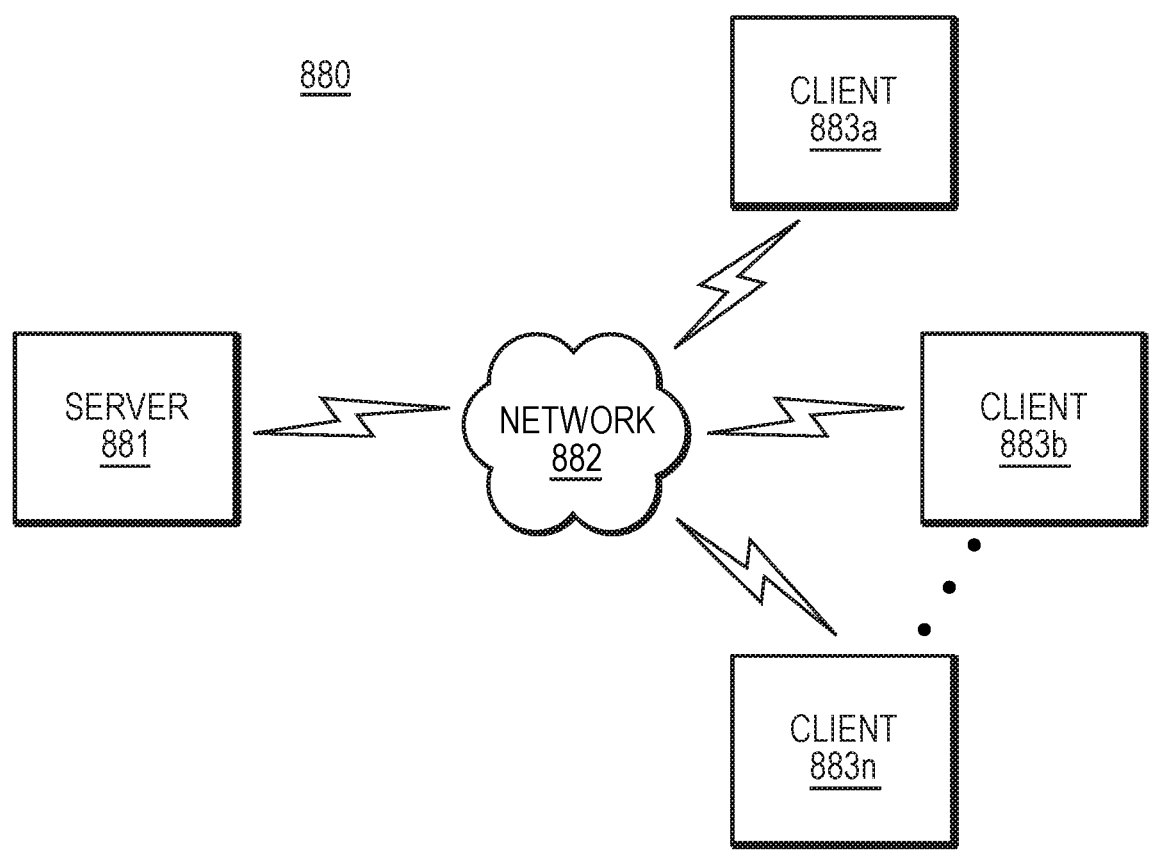
FIG. 8 is a simplified diagram of a computer network environment in which an embodiment of the present invention may be implemented.

FIG. 8 illustrates a computer network environment 880 in which an embodiment of the present invention may be implemented. In the computer network environment 880, the server 881 is linked through the communications network 882 to the clients 883*a-n*. The environment 880 may be used to allow the clients 883*a-n*, alone or in combination with the server 881, to execute any of the methods described herein. For non-limiting example, computer network environment 880 provides cloud computing embodiments, software as a service (SAAS) embodiments, and the like.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and thus, the data processors described herein are intended for purposes of illustration only and not as a limitation of the embodiments.

While example embodiments have been particularly shown and described, it will be understood by those skilled in the art that various changes in form and details may be made therein without departing from the scope of the embodiments encompassed by the appended claims.

What is claimed is:

1. A computer-implemented method of repairing a finite element mesh in a simulation determining behavior of a real-world physical object represented by the finite element mesh, the method comprising:
   identifying a non-compliant mesh element in a finite element mesh representing a real-world physical object;
   extracting a mesh patch from the finite element mesh that includes the identified non-compliant mesh element;
   based on one or more rules executed by a processor, generating an invariant patch topological description for the extracted mesh patch, wherein the generated invariant patch topological description is: (i) a binary sequence, indicated by the one or more rules, that is a function of one or more properties of edges of the extracted mesh patch and (ii) invariant to transformations, specified by the one or more rules, of the extracted mesh patch;
   communicating with a database that stores pre-determined repair solutions and obtaining from the database a repair solution corresponding to the generated invariant patch topological description;
   automatically repairing the mesh patch in the finite element mesh using the obtained repair solution from the database, and said repairing resulting in a repaired finite element mesh stored in computer memory; and
   performing a finite element simulation of the real-world physical object using the repaired finite element mesh stored in the computer memory to determine behavior of the real-world physical object;
   said identifying, extracting, generating, communicating, repairing, and performing being implemented by one or more processors in an automated manner.

2. The method of claim 1 wherein the non-compliant mesh element is identified by a finite element simulation preprocessor.

3. The method of claim 1 wherein the non-compliant mesh element is identified based on at least one of: an angle, skew, aspect ratio, and geometric property of the non-compliant mesh element.

4. The method of claim 1 wherein the extracted mesh patch includes the non-compliant mesh element and each mesh element in the finite element mesh adjacent to the non-compliant mesh element.

5. The method of claim 1 wherein the one or more properties of the edges of the extracted mesh patch include edge type of edges along a perimeter of the extracted mesh patch.

6. The method of claim 1 wherein performing the finite element simulation comprises:
providing the repaired finite element mesh to a finite element simulation solver, and the finite element simulation solver responsively using the repaired finite element mesh in the finite element simulation of the real-world physical object.

7. The method of claim 1 wherein repairing the mesh patch in the finite element mesh includes:
modifying node locations in the mesh patch in accordance with conditions of the finite element simulation.

8. A system for repairing a finite element mesh in a simulation determining behavior of a real-world physical object represented by the finite element mesh, the system comprising:
a processor; and
a memory with computer code instructions stored thereon, the processor and the memory, with the computer code instructions being configured to cause the system to:
identify a non-compliant mesh element in a finite element mesh representing a real-world physical object;
extract a mesh patch from the finite element mesh that includes the identified non-compliant mesh element;
based on one or more rules, generate an invariant patch topological description for the extracted mesh patch, wherein the generated invariant patch topological description is: (i) a binary sequence, indicated by the one or more rules, that is a function of one or more properties of edges of the extracted mesh patch and (ii) invariant to transformations, specified by the one or more rules, of the extracted mesh patch;
communicate with a database that stores pre-determined repair solutions, and obtain from the database a repair solution corresponding to the generated invariant patch topological description;
automatically repair the mesh patch in the finite element mesh using the obtained repair solution from the database, and said repairing resulting in a repaired finite element mesh stored in computer memory; and
perform a finite element simulation of the real-world physical object using the repaired finite element mesh stored in the computer memory to determine behavior of the real-world physical object.

9. The system of claim 8 wherein the non-compliant mesh element is identified by a finite element simulation preprocessor.

10. The system of claim 8 wherein to identify the non-compliant mesh element, the processor and the memory, with the computer code instructions, are further configured to cause the system to identify the non-compliant mesh element based on at least one of: an angle, skew, aspect ratio, and geometric property of the non-compliant mesh element.

11. The system of claim 8 wherein the extracted mesh patch includes the non-compliant mesh element and each mesh element in the finite element mesh adjacent to the non-compliant mesh element.

12. The system of claim 8 wherein the one or more properties of the edges of the extracted mesh patch include edge type of edges along a perimeter of the extracted mesh patch.

13. The system of claim 8 wherein to perform the finite element simulation, the processor and the memory, with the computer code instructions, are further configured to cause the system to:
provide the repaired finite element mesh to a finite element simulation solver, and the finite element simulation solver responsively using the repaired finite element mesh in the finite element simulation of the real-world physical object.

14. The system of claim 8 wherein to repair the mesh patch in the finite element mesh, the processor and the memory, with the computer code instructions, are further configured to cause the system to:
modify node locations in the mesh patch in accordance with conditions of the finite element simulation.

15. A non-transitory computer program product for repairing a finite element mesh in a simulation determining behavior of a real-world physical object represented by the finite element mesh, the computer program product executed by a server in communication across a network with one or more clients and comprising:
a non-transitory computer readable medium, the non-transitory computer readable medium storing program instructions which, when executed by a processor, causes the processor to:
identify a non-compliant mesh element in a finite element mesh representing a real-world physical object;
extract a mesh patch from the finite element mesh that includes the identified non-compliant mesh element;
based on one or more rules, generate an invariant patch topological description for the extracted mesh patch, wherein the generated invariant patch topological description is: (i) a binary sequence, indicated by the one or more rules, that is a function of one or more properties of edges of the extracted mesh patch and (ii) invariant to transformations, specified by the one or more rules, of the extracted mesh patch;
communicate with a database that stores pre-determined repair solutions, and obtain from the database a repair solution corresponding to the generated invariant patch topological description;
automatically repair the mesh patch in the finite element mesh using the obtained repair solution from the database, and said repairing resulting in a repaired finite element mesh stored in computer memory; and
perform a finite element simulation of the real-world physical object using the repaired finite element mesh stored in the computer memory to determine behavior of the real-world physical object.

16. The computer program product of claim 15 wherein the non-compliant mesh element is identified by a finite element simulation preprocessor.

17. The computer program product of claim 15 wherein the instructions, when executed, cause the processor to identify the non-compliant mesh element based on at least one of: an angle, skew, aspect ratio, and geometric property of the non-compliant mesh element.

18. The computer program product of claim 15 wherein the extracted mesh patch includes the non-compliant mesh element and each mesh element in the finite element mesh adjacent to the non-compliant mesh element.

* * * * *